(12) United States Patent
Radkov

(10) Patent No.: US 7,453,195 B2
(45) Date of Patent: Nov. 18, 2008

(54) WHITE LAMPS WITH ENHANCED COLOR CONTRAST

(75) Inventor: Emil Vergilov Radkov, Euclid, OH (US)

(73) Assignee: Lumination LLC, Valley View, OH (US)

( * ) Notice: Subject to any disclaimer, the term of this patent is extended or adjusted under 35 U.S.C. 154(b) by 252 days.

(21) Appl. No.: 11/285,122

(22) Filed: Nov. 22, 2005

(65) Prior Publication Data
US 2006/0071589 A1 Apr. 6, 2006

Related U.S. Application Data

(63) Continuation-in-part of application No. 10/909,564, filed on Aug. 2, 2004.

(51) Int. Cl.
*H01J 1/62* (2006.01)
*H01J 63/04* (2006.01)

(52) U.S. Cl. .................. 313/487; 313/486

(58) Field of Classification Search ......... 313/483–487; 428/403–406; 252/181.1–194
See application file for complete search history.

(56) References Cited

U.S. PATENT DOCUMENTS

| | | | |
|---|---|---|---|
| 6,351,069 B1 | 2/2002 | Lowery et al. | |
| 6,538,371 B1 | 3/2003 | Duggal et al. | |
| 6,621,211 B1 | 9/2003 | Srivastava et al. | |
| 6,680,569 B2 | 1/2004 | Mueller-Mach et al. | |
| 6,717,353 B1 | 4/2004 | Mueller et al. | |
| 6,720,584 B2 | 4/2004 | Hata et al. | |
| 2002/0063520 A1* | 5/2002 | Yu et al. ............... 313/512 |
| 2002/0158565 A1 | 10/2002 | Setlur | |
| 2003/0067008 A1 | 4/2003 | Srivastava et al. | |
| 2004/0000862 A1 | 1/2004 | Setlur et al. | |
| 2005/0029927 A1 | 2/2005 | Setlur et al. | |
| 2006/0022582 A1 | 2/2006 | Radkov | |

FOREIGN PATENT DOCUMENTS

| | | |
|---|---|---|
| EP | 1 138 747 A2 | 10/2001 |
| EP | 1 139 440 | 10/2001 |
| GB | 2 347 018 | 8/2000 |
| GB | 2405409 | 3/2005 |
| WO | WO 0189001 | 11/2001 |
| WO | WO 2005/004202 | 1/2005 |

OTHER PUBLICATIONS

Y. Ohno, "Color Rendering and Luminous Efficacy of White LED Spectra", Proc. SPIE Solid State Lighting Conference, Aug. 3-5, 2004, Denver.

* cited by examiner

*Primary Examiner*—Toan Ton
*Assistant Examiner*—Bumsuk Won
(74) *Attorney, Agent, or Firm*—Fay Sharpe LLP

(57) ABSTRACT

A lighting apparatus for emitting white light including a semiconductor light source emitting radiation with a peak at from about 250 nm to about 500 nm; a first phosphor having a peak emission between about 450 and 550 nm; and a second phosphor having a peak emission between about 615 and 670 nm; wherein the overall emission spectrum of the lighting apparatus has a depression between about 550 and 615 nm, said depression extending to between about 5% and 25% of the highest intensity of the emission spectrum of the lighting apparatus in the region from 400 to 700 nm. In this apparatus, the red-green color contrast is increased versus the referent illuminant.

22 Claims, 12 Drawing Sheets

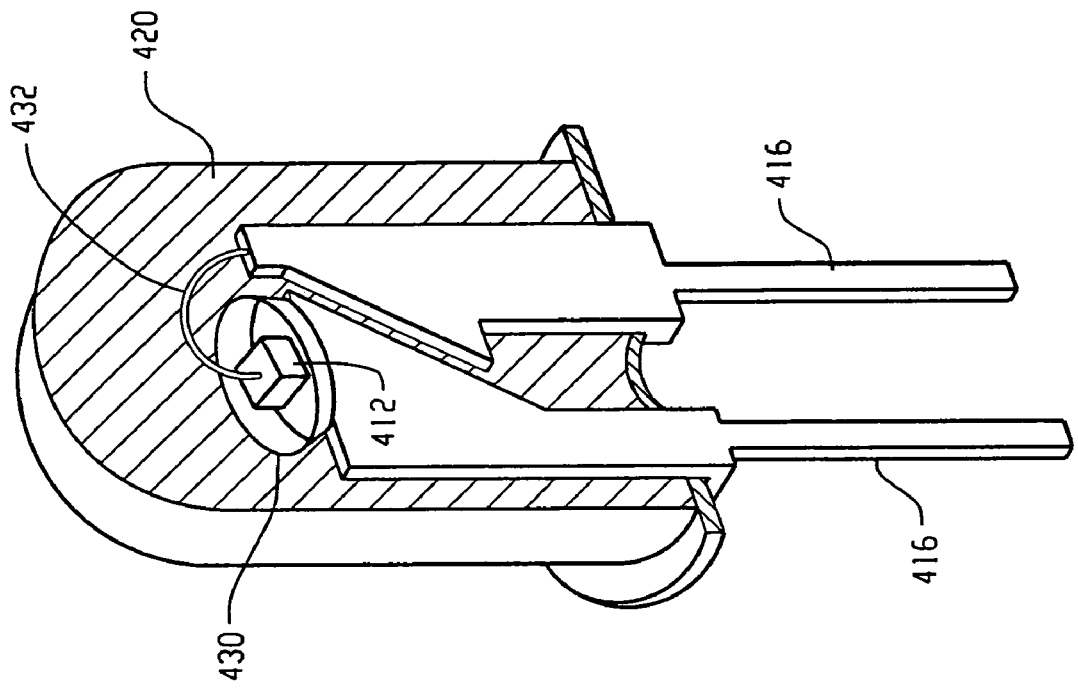
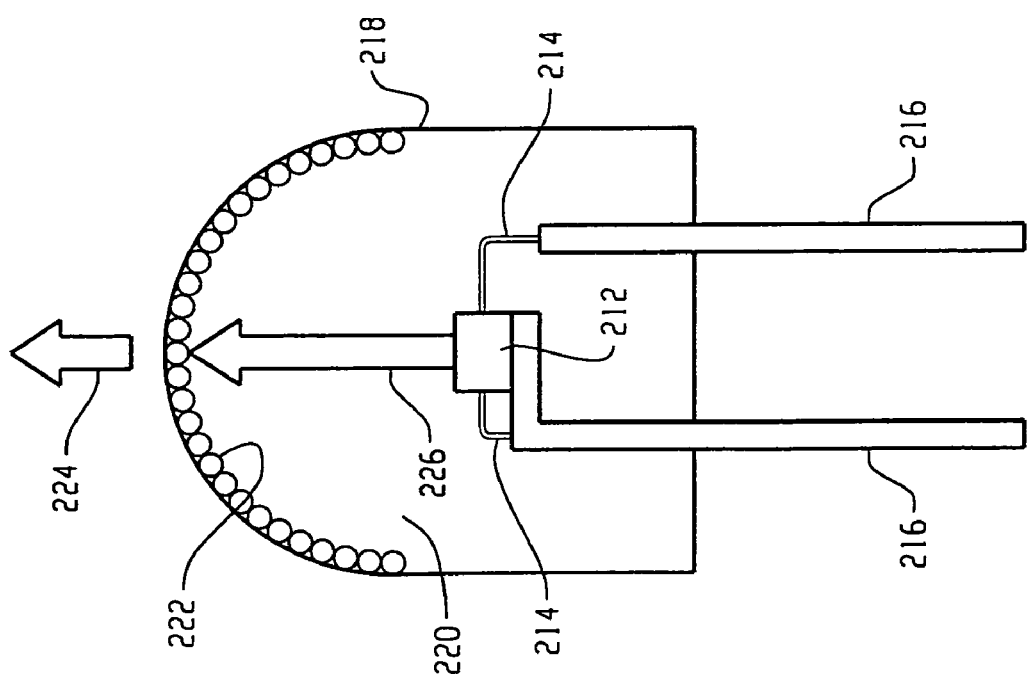

WHITE LAMPS WITH ENHANCED COLOR CONTRAST

This application is a continuation-in-part of commonly assigned U.S. patent application Ser. No. 10/909,564, filed on Aug. 2, 2004.

BACKGROUND OF THE INVENTION

The present exemplary embodiments relate to phosphors for the conversion of radiation emitted by a light source. They find particular application in conjunction with converting LED-generated ultraviolet (UV), violet or blue radiation into white light for general illumination purposes. It should be appreciated, however, that the invention is also applicable to the conversion of radiation in other applications, such as Hg-based fluorescent lamps, mercury-free gas discharge lamps, metal halide lamps, UV, violet and/or blue lasers, as well as other white light sources for different applications.

Light emitting diodes (LEDs) are semiconductor light emitters often used as a replacement for other light sources, such as incandescent lamps. They are particularly useful as display lights, warning lights and indicating lights or in other applications where colored light is desired. The color of light produced by an LED is dependent on the type of semiconductor material used in its manufacture.

Colored semiconductor light emitting devices, including light emitting diodes and lasers (both are generally referred to herein as LEDs), have been produced from Group III-V alloys such as gallium nitride (GaN). To form the LEDs, layers of the alloys are typically deposited epitaxially on a substrate, such as silicon carbide or sapphire, and may be doped with a variety of n and p type dopants to improve properties, such as light emission efficiency. With reference to the GaN-based LEDs, light is generally emitted in the UV and/or blue range of the electromagnetic spectrum. Until quite recently, LEDs have not been suitable for lighting uses where a bright white light is needed, due to the inherent color of the light produced by the LED.

Recently, techniques have been developed for converting the light emitted from LEDs to useful light for illumination purposes. In one technique, the LED is coated or covered with a phosphor layer. A phosphor is a luminescent material that absorbs radiation energy in a portion of the electromagnetic spectrum and emits energy in another portion of the electromagnetic spectrum. Phosphors of one important class are crystalline inorganic compounds of very high chemical purity and of controlled composition to which small quantities of other elements (called "activators") have been added to convert them into efficient fluorescent materials. With the right combination of activators and host inorganic compounds, the color of the emission can be controlled. Most useful and well-known phosphors emit radiation in the visible portion of the electromagnetic spectrum in response to excitation by electromagnetic radiation outside the visible range.

By interposing a phosphor excited by the radiation generated by the LED, light of a different wavelength, e.g., in the visible range of the spectrum, may be generated. Colored LEDs are often used in toys, indicator lights and other devices. Manufacturers are continuously looking for new colored phosphors for use in such LEDs to produce custom colors and higher luminosity.

In addition to colored LEDs, a combination of LED generated light and phosphor generated light may be used to produce white light. The most popular white LEDs are based on blue emitting GaInN chips. The blue emitting chips are coated with a phosphor that converts some of the blue radiation to a complementary color, e.g. a yellow-green emission. The total of the light from the phosphor and the LED chip provides a color point with corresponding color coordinates (x and y on the 1931 CIE chromaticity diagram) and correlated color temperature (CCT), and its spectral distribution provides a color rendering capability, measured by the color rendering index (CRI).

The CRI is commonly defined as a mean value for 8 standard color samples ($R_{1-8}$), usually referred to as the General Color Rendering Index and abbreviated as $R_a$, although 14 standard color samples are specified internationally and one can calculate a broader CRI ($R_{1-14}$) as their mean value. In particular, the $R_9$ value, measuring the color rendering for the strong red, is very important for a range of applications, especially of medical nature. As used herein, "CRI" is used to refer to any of the above general, mean, or special values unless otherwise specified.

Incandescent lamps are known to generate an excessive amount of light in the yellow region of the spectrum, leading to "washing out" of the colors of objects illuminated by them. In response to this, methods have been developed to filter out part of the yellow light through the use of the rare earth element neodymium in the glass envelope. Examples of such lighting systems include the line of REVEAL® light bulbs produced by GE.

A salient feature of the spectrum of REVEAL® bulbs is the deep depression in the yellow region, resulting from the filtration by the neodymium glass, as shown in FIG. 5 (solid line). This yellow depression does not extend to zero spectral intensity, but only to about 15% of the highest intensity of the spectrum between 400 and 700 nm. As a result, the REVEAL® bulbs have a deficiency in the yellow part of the spectrum versus the reference illuminant (shown as a dashed line in FIG. 5). This deficiency leads to increased red-green color contrast when objects are viewed under this lamp, in comparison to a regular incandescent bulb. This has been found to be very appealing to customers.

This filtration significantly reduces the light generated by the lamp. In incandescent lamps, this reduction is tolerable due to the sufficient brightness of such lamps. It would be desirable to develop new lighting systems with similar characteristics as the REVEAL® bulbs. However, a significant lumen loss in new lights (LED lights in particular) is generally unacceptable. Thus, it would be desirable to develop white lamps with similarly enhanced color contrast but without losing any light through filtering.

In addition, it would be desirable to obtain sources with enhanced color contrast and having correlated color temperatures higher than those achievable by neodymium glass-filtered incandescent sources, e.g. significantly higher than 3000K. The invention described herein overcomes this restriction.

BRIEF SUMMARY

In a first aspect, there is provided a lighting apparatus for emitting white light having enhanced red-green color contrast, including a light source emitting radiation with a peak at from about 250 nm to about 500 nm; a first phosphor composition having a peak emission between about 450 and 550 nm; and a second phosphor composition having a peak emission between about 615 and 670 nm; wherein the overall emission spectrum of the lighting apparatus has a depression between about 550 and 615 nm, said depression extending to between about 5% and 25%, more preferably between about 10% and 20% of the highest intensity of the emission spectrum of the lighting apparatus in the region from 400 to 700 nm.

In a second aspect, there is provided a method for making a lighting apparatus for emitting white light having enhanced red-green color contrast, the method including the steps of providing a light source emitting radiation having a peak emission at from about 250 to 500 nm; providing a first phosphor composition having a peak emission between about 450 and 550 nm radiationally coupled to the light source; and providing a second phosphor composition disposed on top of the first phosphor layer second phosphor composition having a peak emission between about 615 and 670 nm; wherein the overall emission spectrum of the lighting apparatus has a depression between about 550 and 615 nm, said depression extending to between about 5% and 25%, more preferably between about 10% and 20% of the highest intensity of the emission spectrum of the lighting apparatus in the region from 400 to 700 nm.

BRIEF DESCRIPTION OF THE DRAWINGS

FIG. 3 is a schematic sectional view of an LED device in accord with a second embodiment.

FIG. 4 is a schematic sectional view of an LED device in accord with a third embodiment.

DETAILED DESCRIPTION OF THE PREFERRED EMBODIMENTS

Phosphors convert radiation (energy) to visible light. Different combinations of phosphors provide different colored light emissions. The colored light that originates from the phosphors provides a color point. The novel combinations presented herein provide light sources with white or substantially white color point (i.e. lying on or substantially on the black body locus) and having enhanced color contrast with respect to the reference illuminants.

A phosphor conversion material (phosphor material) converts generated UV or blue radiation to a different wavelength visible light. The color of the generated visible light is dependent on the particular components of the phosphor material. The phosphor material may include only a single phosphor composition or two or more phosphors of basic color, for example a particular mix with one or more of a yellow and red phosphor to emit a desired color (tint) of light. As used herein, the term "phosphor material" is intended to include both a single phosphor compound as well as a blend of two or more phosphor compounds.

It was determined that a lamp that produces a bright-white light with a reduced emission in the yellow region would be useful to impart qualities desirable to consumers. Therefore, in one embodiment of the invention, a luminescent material phosphor conversion material coated LED chip is disclosed for providing white light. The phosphor material may be an individual phosphor or a phosphor blend of two or more phosphor compositions, including individual phosphors that convert radiation at a specified wavelength, for example radiation with a peak from about 250 to 550 nm as emitted by a UV to visible LED, into a different wavelength visible light. The visible light provided by the phosphor material (and LED chip if emitting visible light) comprises a bright white light with enhanced chroma of illuminated objects.

It will be clear to one skilled in the art that other sources of electromagnetic radiation with a peak from about 250 to 500 nm, e.g. mercury or metal halide discharge, can be used to the same end instead of an LED chip. Thus, while the present embodiments will primarily be described with reference to LEDs, it should be noted that the present embodiments described herein are applicable to and may be used in additional applications besides LEDs. For example, the material may be used as a phosphor in fluorescent lamps (including compact fluorescent lamps), with Hg or Hg-free discharge sources (including metal halide discharge lamps, such as a gallium iodide or iron iodide lamp). These uses are meant to be merely exemplary and not exhaustive. A specific contemplated use for the above phosphors is in a gas discharge lamp (e.g. a mercury discharge lamp) including a lamp envelope containing a pair of electrodes, an ionizable medium contained therein, and a layer of the phosphor on an inner surface of the lamp envelope.

Figure 1:
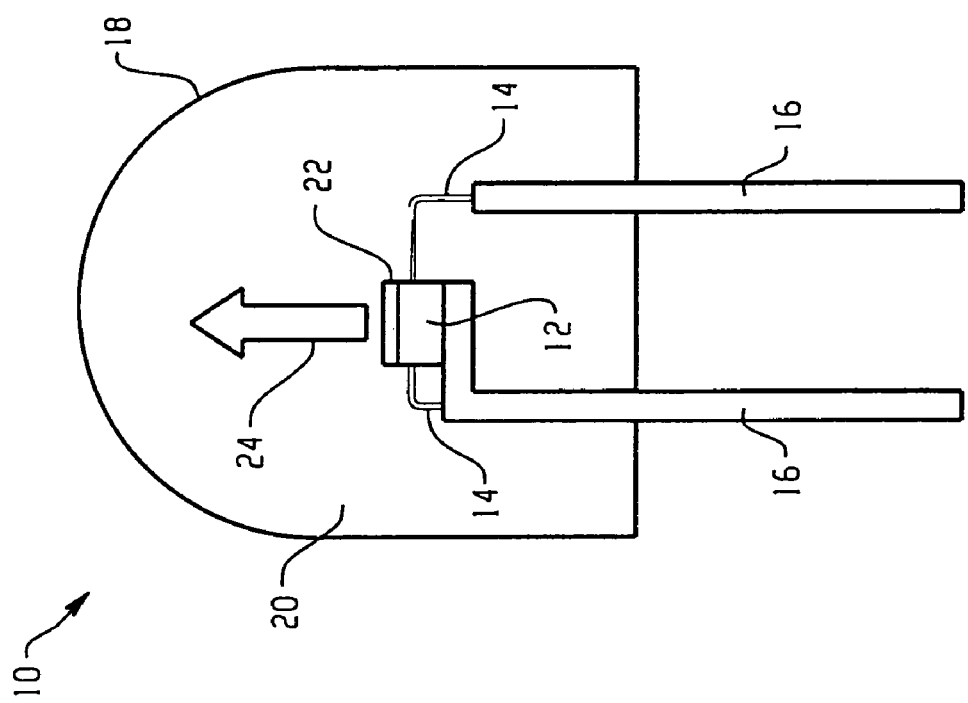
FIG. 1 is a schematic cross-sectional view of a prior art phosphor converted LED illumination system.
Figure 5:
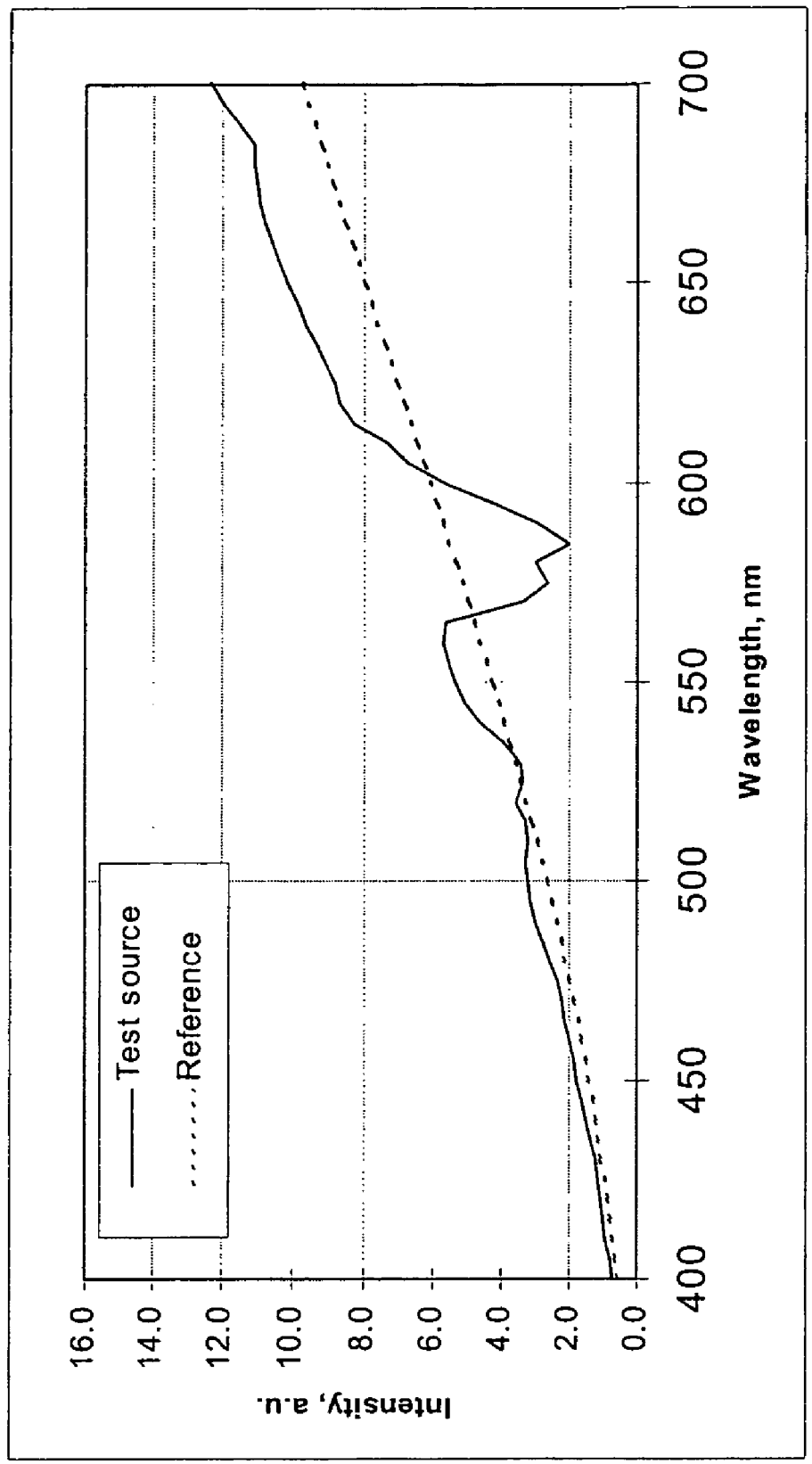
FIG. 5 is an emission spectrum for a prior art neodymium glass filtered incandescent source having a CCT of 2750K.
Figure 6:
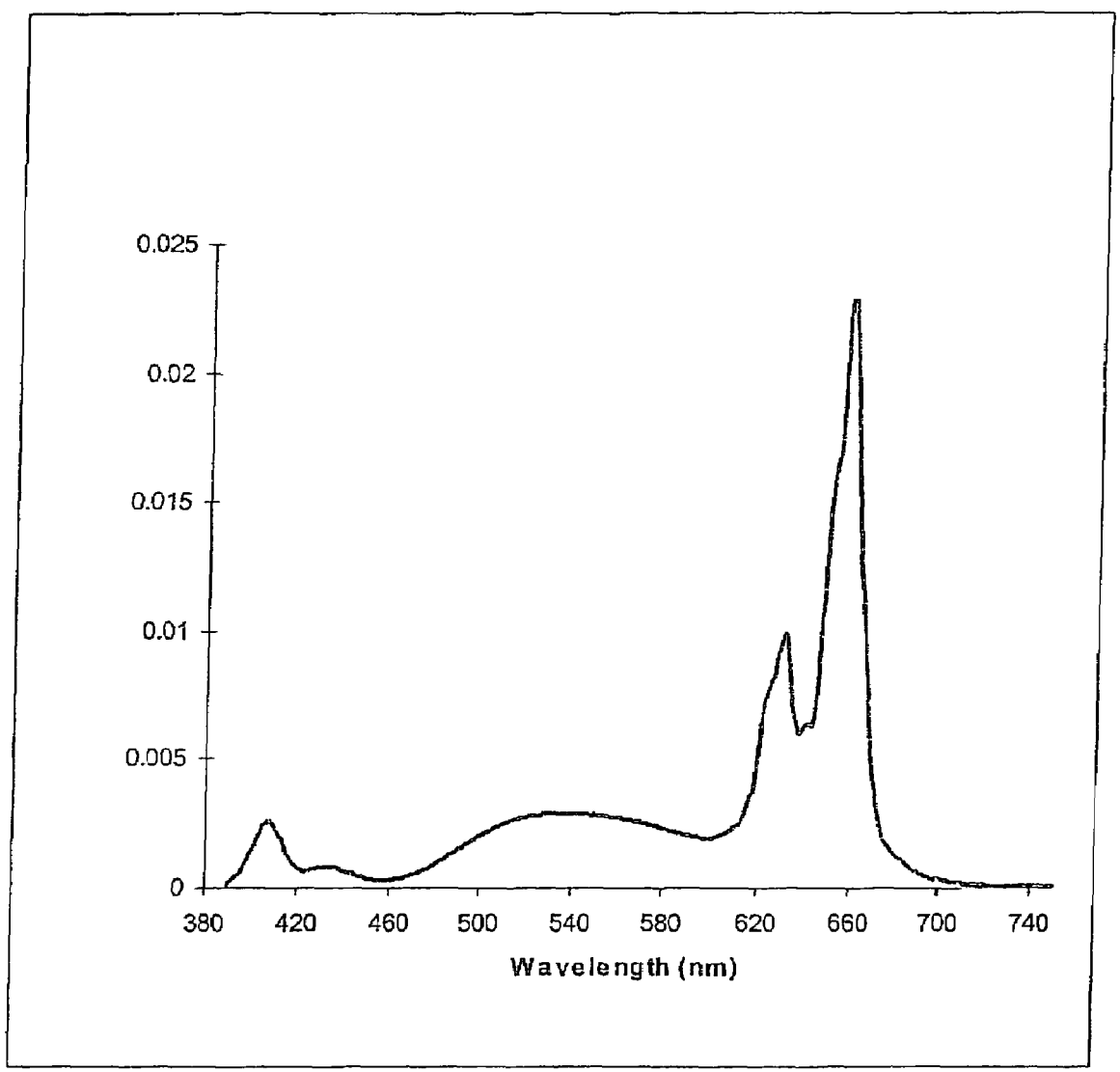
FIG. 6 is an emission spectrum for a multi-phosphor lighting device having a CCT of 2500K in accordance with one embodiment.
Figure 7:
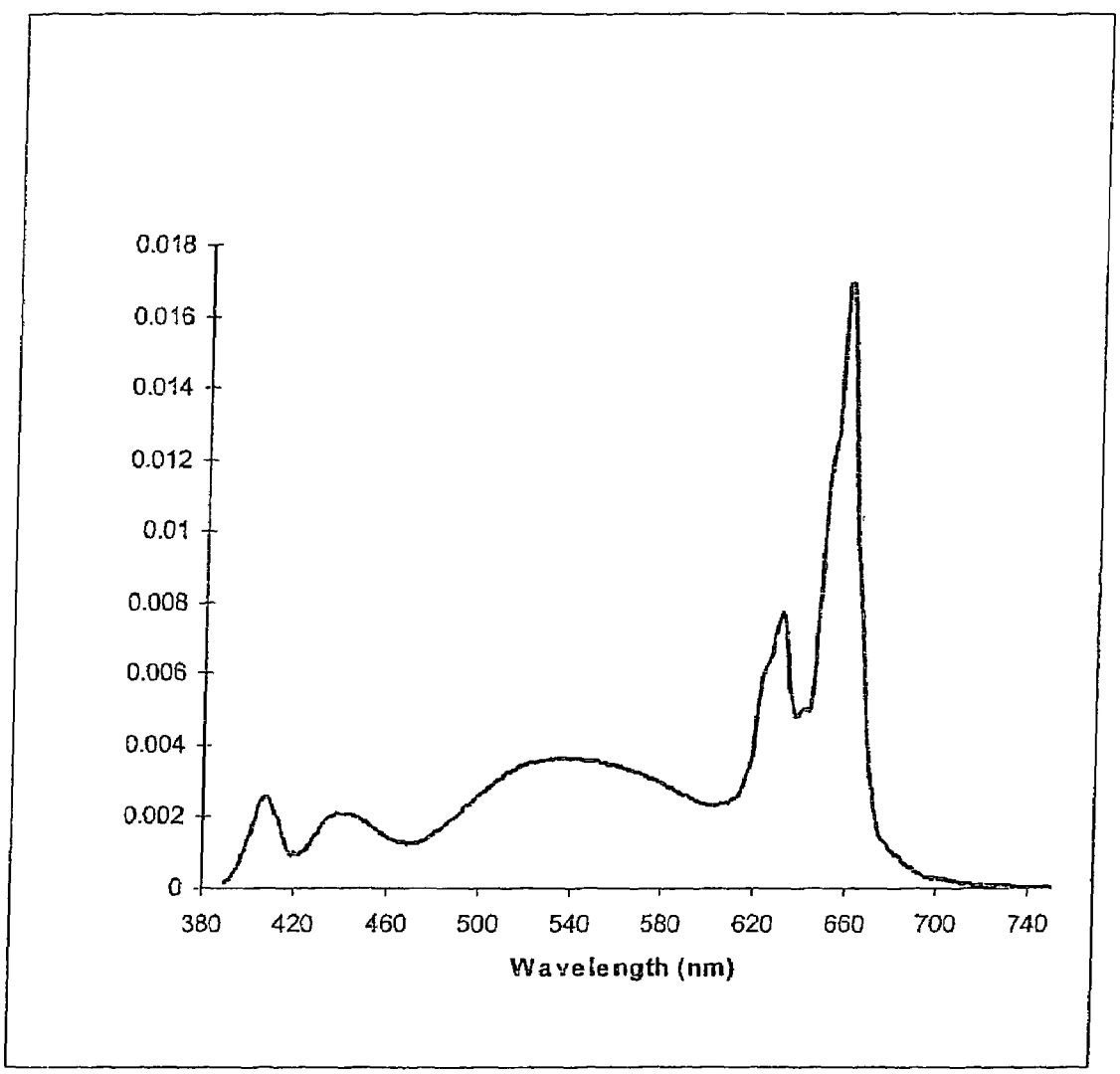
FIG. 7 is an emission spectrum for a multi-phosphor lighting device having a CCT of 3500K in accordance with one embodiment.
Figure 8:
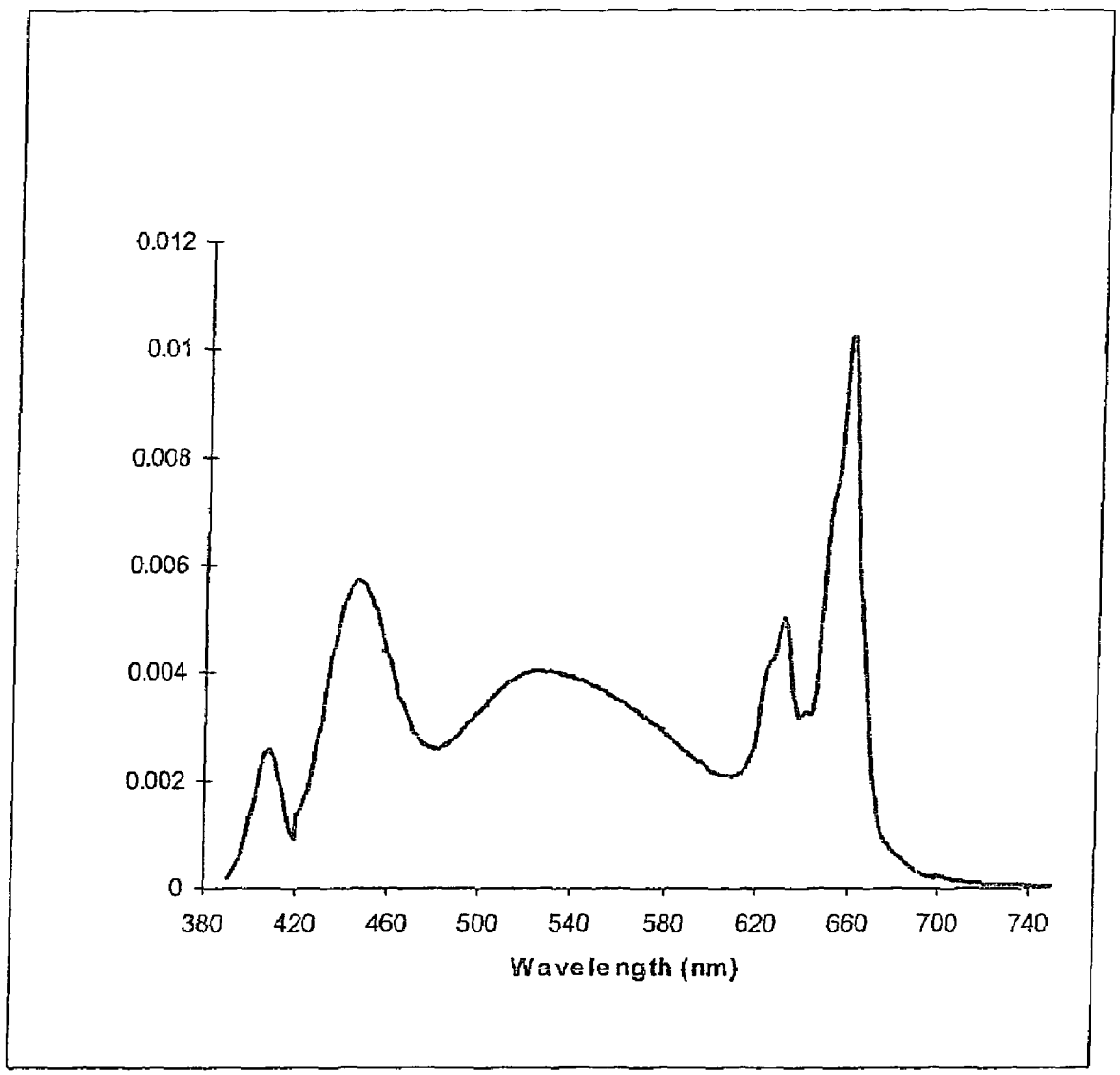
FIG. 8 is an emission spectrum for a multi-phosphor lighting device having a CCT of 6500K in accordance with one embodiment.
Figure 9:
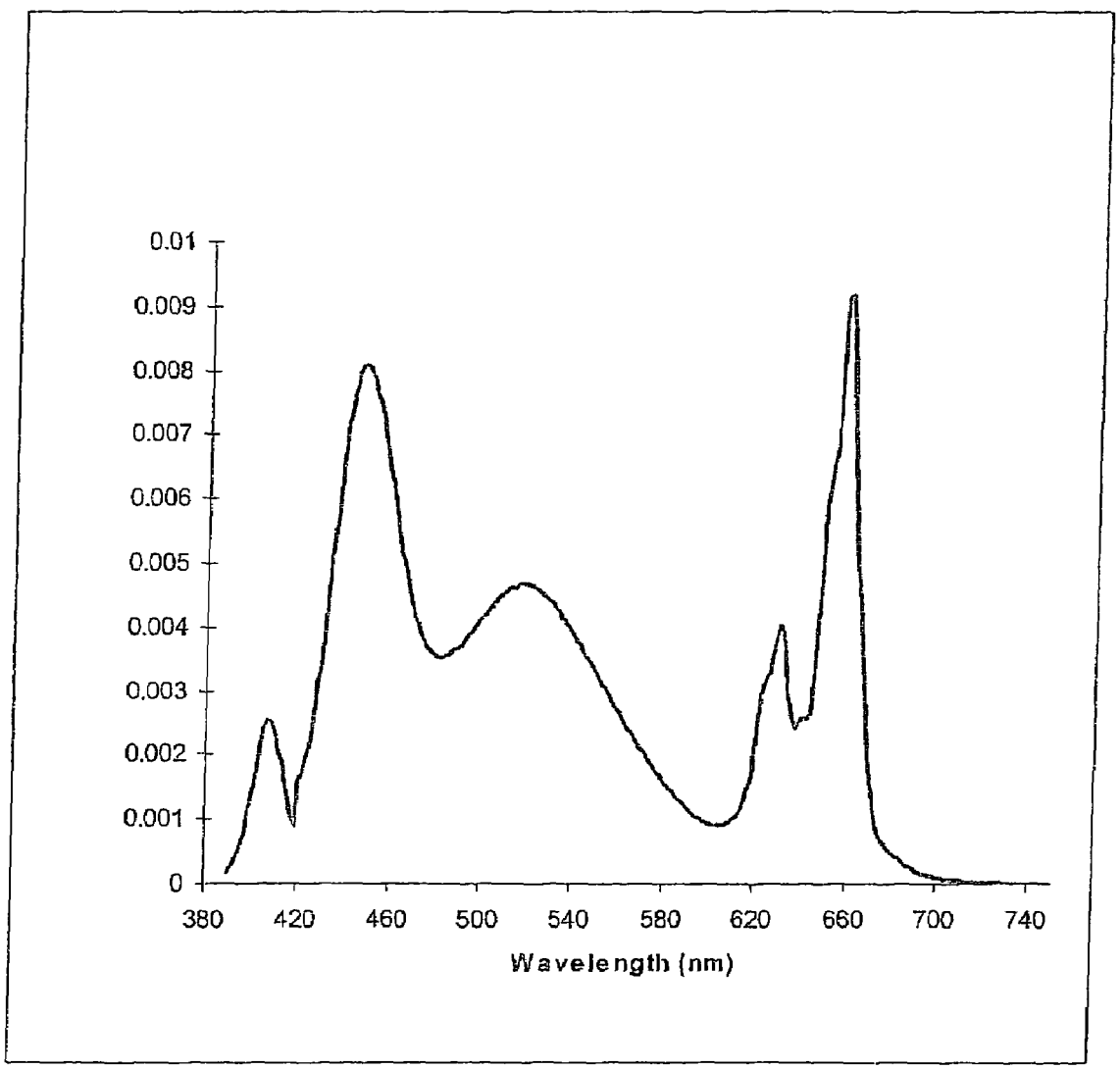
FIG. 9 is an emission spectrum for a multi-phosphor lighting device having a CCT of 17500K in accordance with one embodiment.
Figure 10:
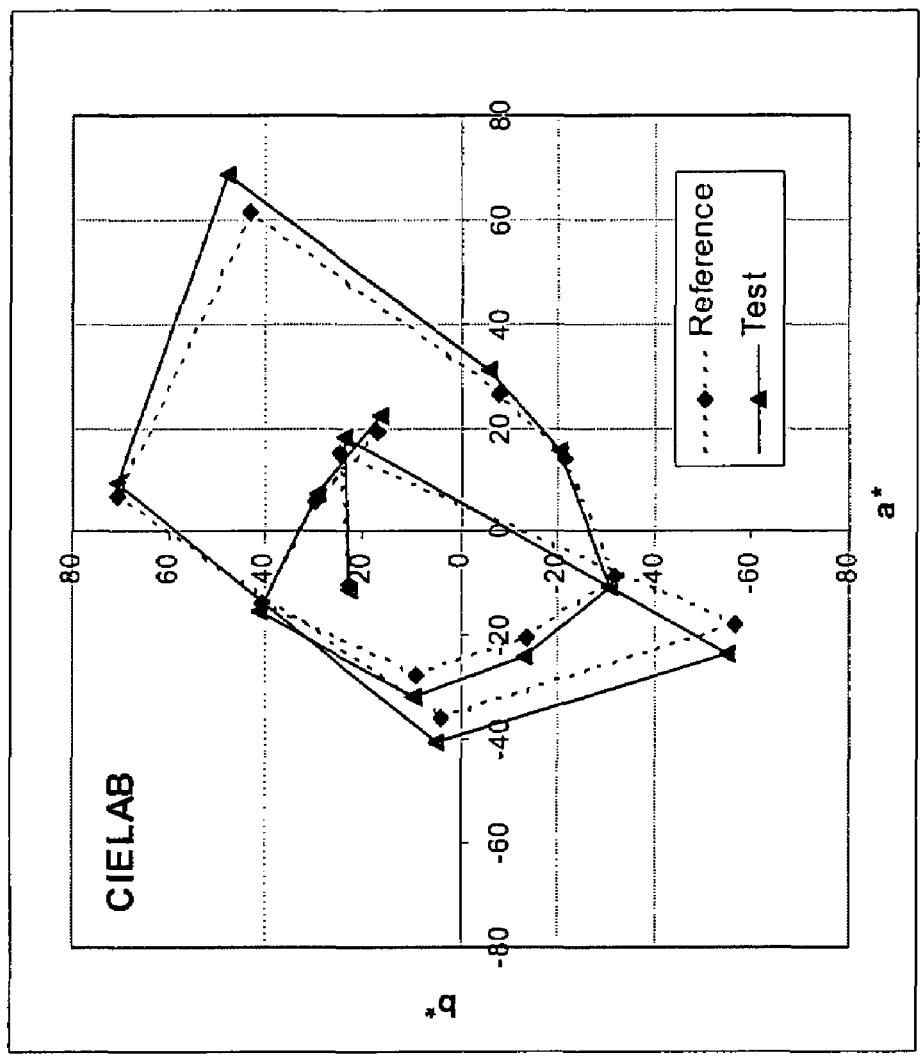
FIG. 10 is a CIELAB diagram for a prior art neodymium glass filtered incandescent source having a CCT of 2750K in accordance with one embodiment.
Figure 11:
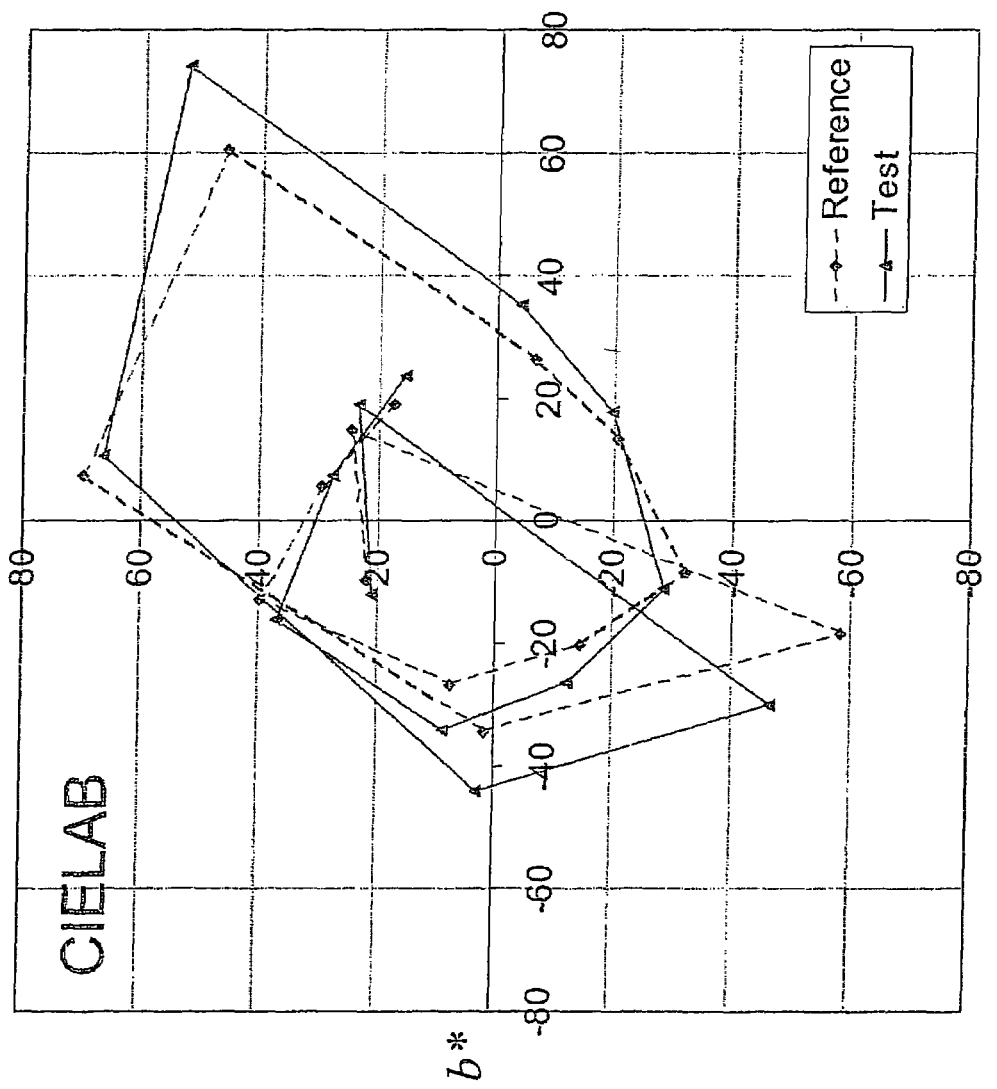
FIG. 11 is a CIELAB diagram for a multi-phosphor lighting device having a CCT of 2500K in accordance with one embodiment.
Figure 12:
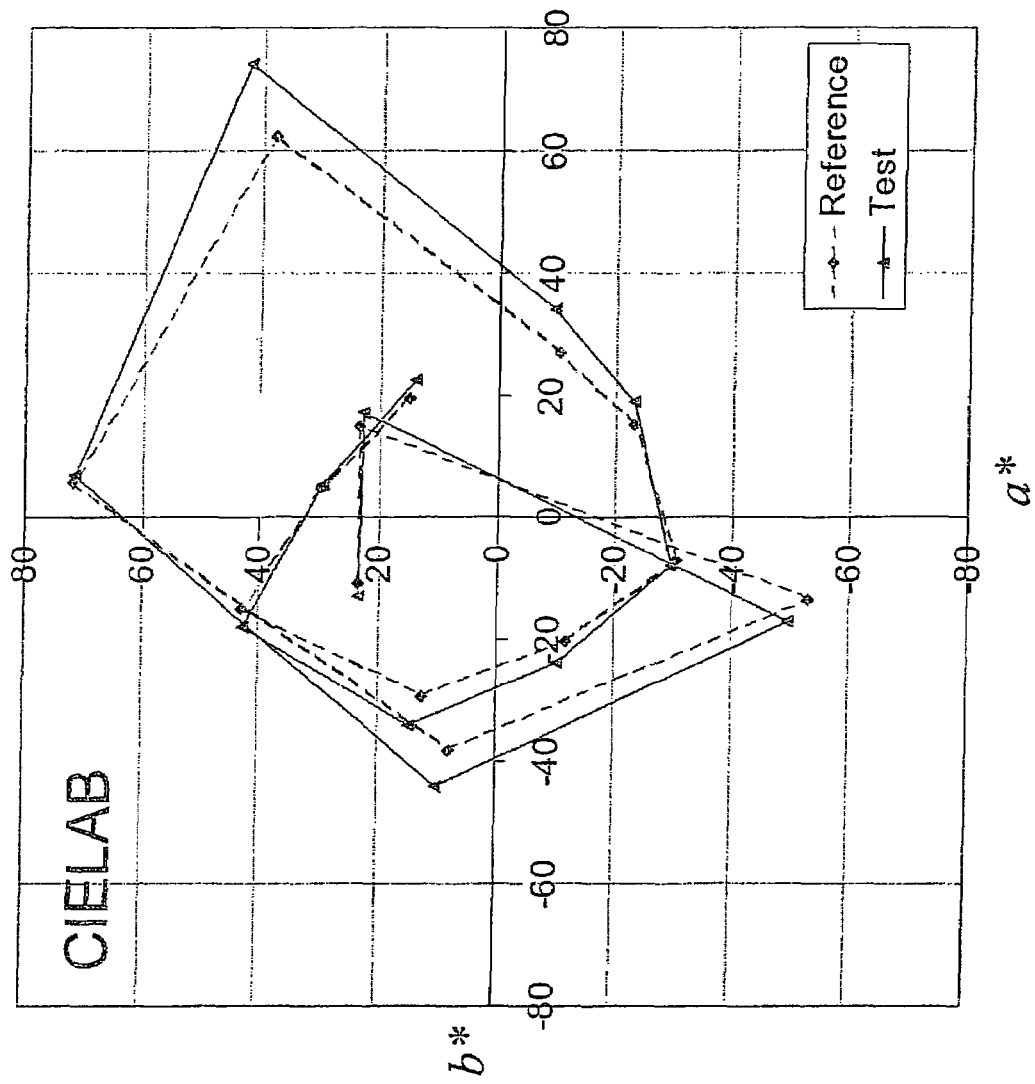
FIG. 12 is a CIELAB diagram for a multi-phosphor lighting device having a CCT of 3500K in accordance with one embodiment.
Figure 13:
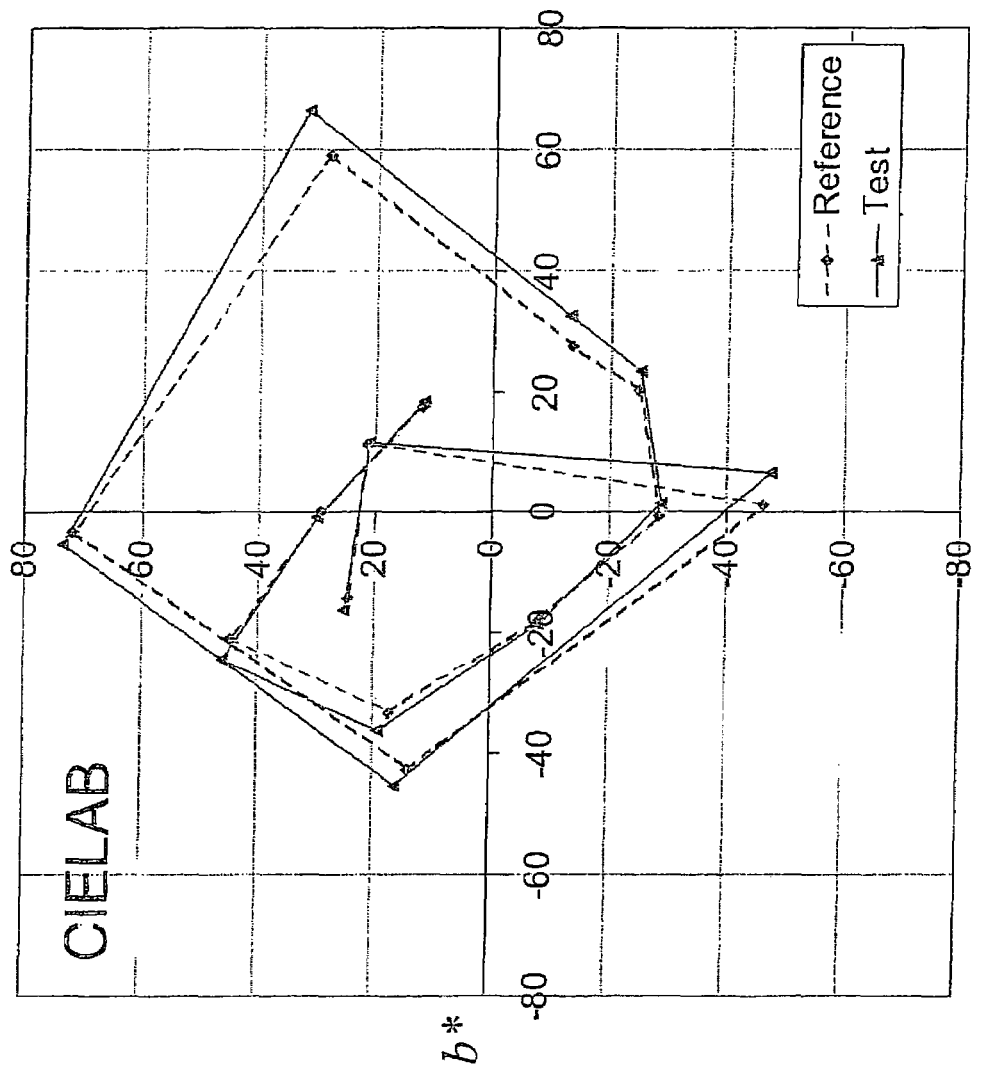
FIG. 13 is a CIELAB diagram for a multi-phosphor lighting device having a CCT of 6500K in accordance with one embodiment.
Figure 14:
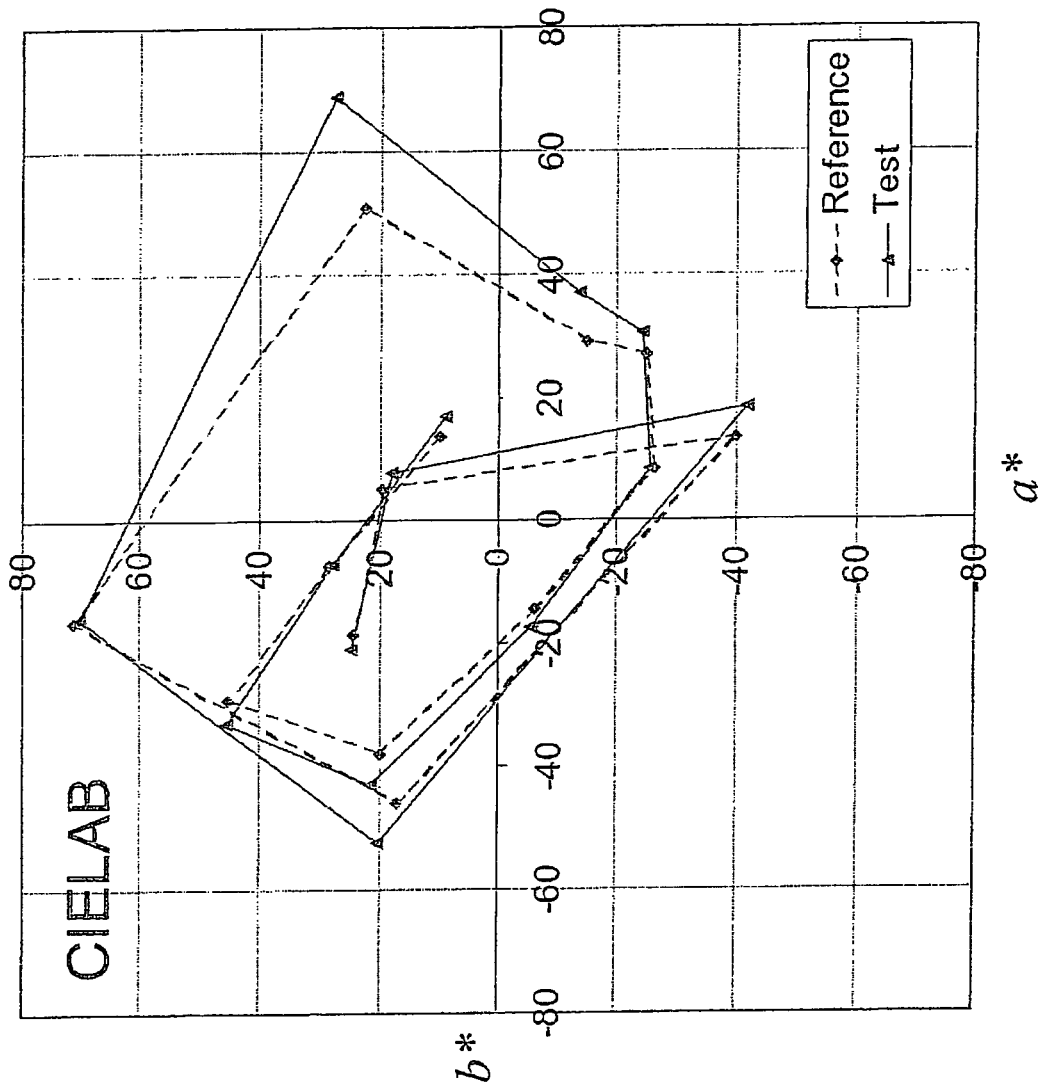
FIG. 14 is a CIELAB diagram for a multi-phosphor lighting device having a CCT of 17500K in accordance with one embodiment.

With reference to FIG. 1, an exemplary LED based light emitting assembly or lamp 10 is shown in accordance with one preferred structure of the present invention. The light emitting assembly 10 comprises a semiconductor UV or visible radiation source, such as a light emitting diode (LED) chip 12 and leads 14 electrically attached to the LED chip. The leads 14 may comprise thin wires supported by a thicker lead frame(s) 16 or the leads may comprise self-supported electrodes and the lead frame may be omitted. The leads 14 provide current to the LED chip 12 and thus cause the LED chip 12 to emit radiation.

The lamp may include any visible or UV light source that is capable of producing white light when its emitted radiation is directed onto the phosphor. A particularly preferred source is an LED chip. The preferred peak emission of the LED chip in the present invention will depend on the identity of the phosphors in the disclosed embodiments and may range from, e.g., 250-500 nm. In one preferred embodiment, however, the emission of the LED will be in the near UV to deep blue region and have a peak wavelength in the range from about 350 to about 430 nm. Typically then, the semiconductor light source comprises an LED doped with various impurities. Thus, the LED may comprise a semiconductor diode based on any suitable III-V, II-VI or IV-IV semiconductor layers and having an emission wavelength of about 250 to 500 nm.

Preferably, the LED may contain at least one semiconductor layer comprising GaN, ZnO or SiC. For example, the LED may comprise a nitride compound semiconductor represented by the formula $In_iGa_jAl_kN$ (where $0 \leq i$; $0 \leq j$; $0 \leq k$ and $i+j+k=1$) having a peak emission wavelength greater than about 250 nm and less than about 500 nm. Such LED semiconductors are known in the art. The radiation source is described herein as an LED for convenience. However, as used herein, the term is meant to encompass all semiconductor radiation sources including, e.g., semiconductor laser diodes.

Although the general discussion of the exemplary structures of the invention discussed herein are directed toward inorganic LED based light sources, it should be understood that the LED chip may be replaced by an organic light emissive structure or other radiation source unless otherwise noted and that any reference to LED chip or semiconductor is merely representative of any appropriate radiation source.

The LED chip 12 may be encapsulated within a shell 18, which encloses the LED chip and an encapsulant material 20. The shell 18 may be, for example, glass or plastic. Preferably, the LED 12 is substantially centered in the encapsulant 20. The encapsulant 20 is preferably an epoxy, plastic, low temperature glass, polymer, thermoplastic, thermoset material, resin or other type of LED encapsulating material as is known in the art. Optionally, the encapsulant 20 is a spin-on glass or some other high index of refraction material. Preferably, the encapsulant material 20 is an epoxy or a polymer material, such as silicone. Both the shell 18 and the encapsulant 20 are preferably transparent or substantially optically transmissive with respect to the wavelength of light produced by the LED chip 12 and a phosphor material 22 (described below). In an alternate embodiment, the lamp 10 may only comprise an encapsulant material without an outer shell 18. The LED chip 12 may be supported, for example, by the lead frame 16, by the self supporting electrodes, the bottom of the shell 18, or by a pedestal (not shown) mounted to the shell or to the lead frame.

The structure of the illumination system includes a phosphor material 22 radiationally coupled to the LED chip 12. Radiationally coupled means that the elements are associated with each other so radiation from one is transmitted to the other.

This phosphor material 22 is deposited on the LED 12 by any appropriate method. For example, a water based suspension of the phosphor(s) can be formed, and applied as a phosphor layer to the LED surface. In one such method, a silicone slurry in which the phosphor particles are randomly suspended is placed around the LED. This method is merely exemplary of possible positions of the phosphor material 22 and LED 12. Thus, the phosphor material 22 may be coated over or directly on the light emitting surface of the LED chip 12 by coating and drying the phosphor suspension over the LED chip 12. Both the shell 18 and the encapsulant 20 should be transparent to allow light 24 to be transmitted through those elements. Although not intended to be limiting, in one embodiment, the median particle size of the phosphor material may be from about 1 to about 20 microns.

Figure 2:
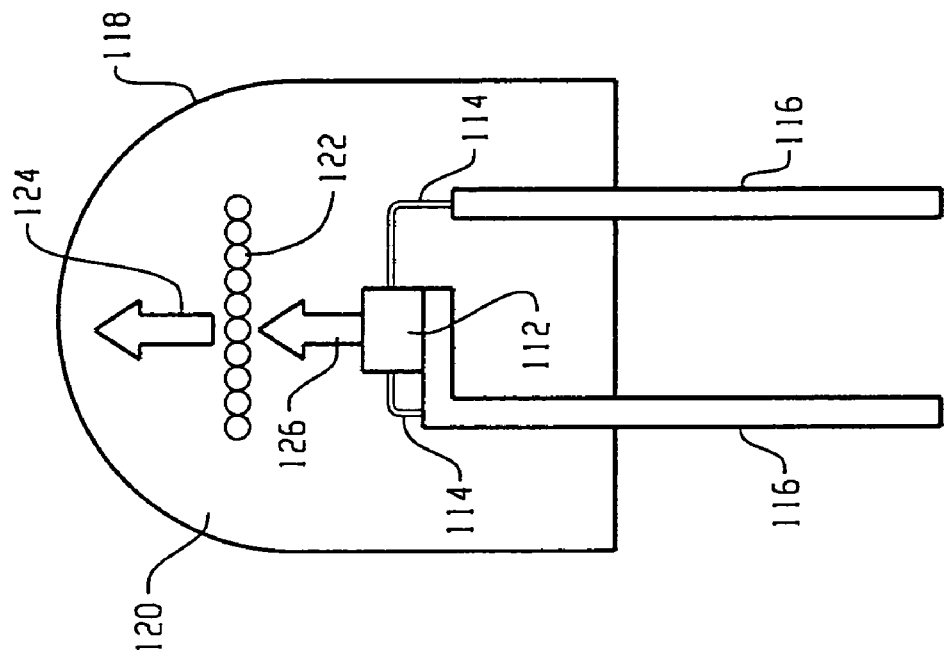
FIG. 2 is a schematic sectional view of an LED device in accord with a first embodiment.

FIG. 2 illustrates a second preferred structure of the system according to the preferred aspect of the present invention. The structure of the embodiment of FIG. 2 is similar to that of FIG. 1, except that the phosphor material 122 is interspersed within the encapsulant material 120, instead of being formed directly on the LED chip 112. The phosphor material (in the form of a powder) may be interspersed within a single region of the encapsulant material 120 or, more preferably, throughout the entire volume of the encapsulant material. Radiation 126 emitted by the LED chip 112 mixes with the light emitted by the phosphor material 122, and the mixed light appears as white light 124. If the phosphor is to be interspersed within the encapsulant material 120, then a phosphor powder may be added to a polymer precursor, loaded around the LED chip 112, and then the polymer precursor may be cured to solidify the polymer material. Other known phosphor interspersion methods may also be used, such as transfer loading.

FIG. 3 illustrates a third preferred structure of the system according to the preferred aspects of the present invention. The structure of the embodiment shown in FIG. 3 is similar to that of FIG. 1, except that the phosphor material 222 is coated onto a surface of the shell 218, instead of being formed over the LED chip 212. The phosphor material is preferably coated on the inside surface of the shell 218, although the phosphor may be coated on the outside surface of the shell, if desired. The phosphor material 222 may be coated on the entire surface of the shell or only a top portion of the surface of the shell. The radiation 226 emitted by the LED chip 212 mixes with the light emitted by the phosphor material 222, and the mixed light appears as white light 224. Of course, the structures of FIGS. 1-3 may be combined and the phosphor may be located in any two or all three locations or in any other suitable location, such as separately from the shell or integrated into the LED.

In any of the above structures, the lamp 10 may also include a plurality of scattering particles (not shown), which are embedded in the encapsulant material. The scattering particles may comprise, for example, $Al_2O_3$ particles (such as alumina powder) or $TiO_2$ particles. The scattering particles effectively scatter the light emitted from the LED chip, preferably with a negligible amount of absorption.

As shown in a fourth preferred structure in FIG. 4, the LED chip 412 may be mounted in a reflective cup 430. The cup 430 may be made from or coated with a reflective material, such as alumina, titania, or other dielectric powder known in the art. A preferred reflective material is $Al_2O_3$. The remainder of the structure of the embodiment of FIG. 4 is the same as that of any of the previous Figures, and includes two leads 416, a conducting wire 432 electrically connecting the LED chip 412 with the second lead, and an encapsulant material 420.

In one embodiment, there is provided a novel phosphor composition, which may be used in the phosphor composition 22 in the above described LED light, wherein the composition includes a blend of at least two phosphors including a first phosphor having a peak emission between about 450 and 550 nm; and a second phosphor having a peak emission between about 615 and 670 nm; wherein the overall emission spectrum of the lighting apparatus has a depression between about 550 and 615 nm, said depression extending to between about 5% and 25%, more preferably between about 10% and 20% of the highest intensity of the emission spectrum of the lighting apparatus in the region from 400 to 700 nm.

By "depression", it is meant that the combined emission spectrum of the lighting apparatus, which is the combined emission of all phosphors present in the device as well as any residual source emission bleed, has a relatively decreased emission intensity in the specified wavelength range. This depression is not necessarily an absolute intensity minimum over the entire emission spectrum, but merely a region where the emission intensity reaches a local minimum in the yellow range between about 550 and 615 nm. The emission intensity does not need to reach zero (or baseline level) at the lowest depression point, but should drop to between about 5% and 25%, more preferably between about 10% and 20%, of the highest intensity of the emission spectrum of the lighting apparatus in the region from 400 to 700 nm, as shown in FIGS. 6-9 and in Table 1. Thus, the salient feature of the spectrum of a REVEAL® bulb is approximated, not by filtration but rather by phosphor selection, thereby avoiding unnecessary light loss.

The first phosphor material can be any individual phosphor compound or blend of phosphor compounds having a peak emission between about 450 and 550 nm when excited with radiation from the excitation source. Multiple emission peaks in the same range are also acceptable, as shown in the examples. As detailed above, the excitation source in one embodiment is a UV to blue light emitting LED. Thus, the phosphors are preferably efficient absorbers in this range. Phosphors that satisfy this requirement are known. Exemplary, but non-limiting examples of suitable phosphor compounds for use as the first phosphor material in the present embodiments include $(Ca,Sr,Ba)Al_2O_4:Eu^{2+}$, $(Mg,Ca,Sr,Ba)_5(PO_4)_3(F,Cl,Br,OH):Eu^{2+}$, $Sr_4A_{14}O_{25}:Eu^{2+}$, and $(Ca,Sr,Ba)MgAl_{10}O_{17}:Eu^{2+},Mn^{2+}$.

It should be noted that various phosphors are described herein in which different elements enclosed in parentheses and separated by commas, such as in the above $(Ca,Sr,Ba)Al_2O_4:Eu^{2+}$ phosphor. As understood by those skilled in the art, this type of notation means that the phosphor can include any or all of those specified elements in the formulation in any ratio. That is, this type of notation for the above phosphor, for example, has the same meaning as $(Ca_{1-a-b}Sr_aBa_b)Al_2O_4:Eu^{2+}$, wherein $0 \leq a,b \leq 1$.

The second phosphor material can be any individual phosphor compound or blend of phosphor compounds having a peak emission between about 615 and 670 nm when excited with radiation from the excitation source. Multiple emission peaks in the same range are also acceptable, as shown in the examples. As detailed above, the LED in one embodiment is a UV to blue light emitting LED. Thus, the phosphors are preferably efficient absorbers in this range. Phosphors that satisfy this requirement are known. Exemplary, but non-limiting examples of suitable phosphor compounds for use as the second phosphor material in the present embodiments include $3.5MgO*0.5MgF_2*GeO_2:Mn^{4+}$, $(Mg,Ca,Sr,Ba,Zn)_4Si_2O_8:Eu^{2+},Mn^{2+}$, $CaAlSiN_3:Eu^{2+}$ and $A_2[MF_6]:Mn^{4+}$ where A=Li, Na, K, Rb or Cs and M=Ge, Si, Sn, Ti or Zr.

Other phosphors in addition to or in place of the above phosphors may be used. Other suitable phosphors for use in the phosphor compositions include:

$(Ca,Sr,Ba)_2Si_{1-c}O_{4-2c}:Eu^{2+}$ where $0 \leq c < 0.25$
$(Ba,Sr,Ca)_5(PO_4)_3(Cl,F,Br,OH):Sb^{3+},Mn^{2+}$
$(Mg,Ca, Sr,Ba,Zn)_5(PO_4)_3(F,Cl, Br,OH):Eu^{2+},Mn^{2+}$
$(Ba,Sr,Ca)BPO_5:Eu^{2+},Mn^{2+}$
$(Sr,Ca)_{10}(PO_4)_6*nB_2O_3:Eu^{2+}$
$Sr_2Si_3O_8*2SrCl_2:Eu^{2+}$
$Ba_3MgSi_2O_8: Eu^{2+}$
$BaAl_8O_{13}: Eu^{2+}$
$2SrO*0.84P_2O_5*0.16B_2O_3:Eu^{2+}$;
$(Ba,Sr,Ca)Al_2O_4:Eu^{2+}$
$(Y,Gd,Lu,Sc,La)BO_3:Ce^{3+},Tb^{3+}$
$Ca_8Mg(SiO_4)_4Cl_2:Eu^{2+}$
$Mn^{2+} (Ba,Sr,Ca)_2(Mg,Zn)Si_2O_7:Eu^{2+}$
$(Sr,Ca,Ba)(Al,Ga,In)_2S_4:Eu^{2+}$
$(Y,Gd,Tb,La,Sm,Pr, Lu)_3(Al,Ga)_5O_{12}:Ce^{3+}$
$(Ca,Sr)_8(Mg,Zn)(SiO_4)_4Cl_2: Eu^{2+},Mn^{2+}$
$Na_2Gd_2B_2O_7:Ce^{3+}, Tb^{3+}$
$(Sr,Ca,Ba,Mg,Zn)_2P_2O_7:Eu^{2+},Mn^{2+}$
$(Ca,Sr,Ba,Mg, Zn)_{10}(PO_4)_6(F,Cl,Br,OH)_2:Eu^{2+},Mn^{2+}$
$(Gd,Y,Lu,La)_2O_3:Eu^{3+},Bi^{3+}$
$(Gd,Y,Lu,La)_2O_2S:Eu^{3+},Bi^{3+}$
$(Gd,Y,Lu,La)VO_4:Eu^{3+},Bi^{3+}$
$SrY_2S_4:Eu^{2+}$
$CaLa_2S_4:Ce^{3+}$
$(Ca,Sr)S:Eu^{2+}$
$(Ba,Sr,Ca)MgP_2O_7:Eu^{2+},Mn^{2+}$
$(Y,Lu)_2WO_6:Eu^{3+},Mo^{6+}$
$(Ba,Sr,Ca)_u Si_v(N,O)_w:Eu^{2+}$
$(Lu,Ca,Li,Mg,Y)$alpha-SiAlON doped with $Eu^{2+}$ and/or $Ce^{3+}$.

For purposes of the present application, it should be understood that when a phosphor has two or more dopant ions (i.e. those ions following the colon in the above compositions), this is meant to mean that the phosphor has at least one (but not necessarily all) of those dopant ions within the material. That is, as understood by those skilled in the art, this type of notation means that the phosphor can include any or all of those specified ions as dopants in the formulation.

It will be appreciated by a person skilled in the art that other phosphor compounds with sufficiently similar emission spectra may be used instead of any of the preceding suitable examples, even though the chemical formulations of such substitutes may be significantly different from the aforementioned examples.

The specific amounts of the individual phosphor compounds used in the phosphor compositions will depend upon the desired color temperature. The relative amounts of each phosphor in the phosphor compositions can be described in terms of spectral weight. The spectral weight is the relative amount that each phosphor contributes to the overall emission spectrum of the phosphor composition. Additionally, part of the LED light may be allowed to bleed through and contribute to the light spectrum of the device if necessary. The amount of LED bleed can be adjusted by changing the optical density of the phosphor layer, as routinely done for industrial blue chip based white LEDs. Alternatively, it may be adjusted by using a suitable filter or a pigment, as described further below.

The spectral weight amounts of all the individual phosphors in each phosphor composition should add up to 1 (i.e. 100%) of the emission spectrum of the individual phosphor composition. Likewise, the spectral weight amounts of all of the phosphor compositions and any residual bleed from the LED source should add up to 100% of the emission spectrum of the light device.

The ratio of each of the individual phosphor compounds in each of the phosphor compositions may vary depending on the characteristics of the desired light output. The relative proportions of the individual phosphors in the various embodiment phosphor compositions may be adjusted such that when their emissions are blended and employed in an LED lighting device, there is produced visible light of predetermined x and y values on the CIE chromaticity diagram, provided that the combined spectral output has a relative depression in emission intensity at some wavelength between 550 and 615 nm. A white light is preferably produced, with a color point lying on or substantially on the black body locus (e.g. within 0.020 units along the vertical direction in the CIE 1931 x,y diagram). As stated, however, the exact identity and amounts of each phosphor compound in the phosphor composition can be varied according to the needs of the end user.

The above described phosphor compounds may be produced using known solid state reaction processes for the production of phosphors by combining, for example, elemental oxides, carbonates and/or hydroxides as starting materials. Other starting materials may include nitrates, sulfates, acetates, citrates, or oxalates. In a typical process, the starting materials are combined via a dry or wet blending process and fired in air or under a reducing atmosphere at from, e.g., 900 to 1600° C.

A fluxing agent may be added to the mixture before or during the step of mixing. This fluxing agent may be $NH_4Cl$ or any other conventional fluxing agent, such as a fluoride of at least one metal selected from the group consisting of terbium, aluminum, gallium, and indium. A quantity of a fluxing agent of less than about 20, preferably less than about 10, percent by weight of the total weight of the mixture is adequate for fluxing purposes.

The starting materials may be mixed together by any mechanical method including, but not limited to, stirring or blending in a high-speed blender or a ribbon blender. The starting materials may be combined and pulverized together in a ball mill, a hammer mill, or a jet mill. The mixing may be carried out by wet milling especially when the mixture of the starting materials is to be made into a solution for subsequent precipitation. If the mixture is wet, it may be dried first before being fired under a reducing atmosphere at a temperature from about 900° C. to about 1700° C., preferably from about 900° C. to about 1500° C., for a time sufficient to convert all of the mixture to the final material.

The firing may be conducted in a batchwise or continuous process, preferably with a stirring or mixing action to promote good gas-solid contact. The firing time depends on the quantity of the mixture to be fired, the rate of gas conducted through the firing equipment, and the quality of the gas-solid contact in the firing equipment. Typically, a firing time up to about 10 hours is adequate. The reducing atmosphere typically comprises a reducing gas such as hydrogen, carbon monoxide, or a combination thereof, optionally diluted with an inert gas, such as nitrogen, argon, or a combination thereof. Alternatively, the crucible containing the mixture may be packed in a second closed crucible containing high-purity carbon particles and fired in air so that the carbon particles react with the oxygen present in air, thereby, generating carbon monoxide for providing a reducing atmosphere.

In one embodiment, these compounds may be blended and dissolved in a nitric acid solution. The strength of the acid solution is chosen to rapidly dissolve the oxygen-containing compounds and the choice is within the skill of a person skilled in the art. Ammonium hydroxide is then added in increments to the acidic solution. An organic base such as a water-soluble amine may be used in place of ammonium hydroxide.

The precipitate may be filtered, washed with deionized water, and dried. The dried precipitate may be ball milled or otherwise thoroughly blended and then calcined in air at about 400° C. to about 1600° C. for a sufficient time to ensure a substantially complete dehydration of the starting material. The calcination may be carried out at a constant temperature. Alternatively, the calcination temperature may be ramped from ambient to and held at the final temperature for the duration of the calcination. The calcined material is similarly fired at 1000-1600° C. for a sufficient time under a reducing atmosphere such as $H_2$, CO, or a mixture of one of these gases with an inert gas, or an atmosphere generated by a reaction between a coconut charcoal and the products of the decomposition of the starting materials to covert all of the calcined material to the desired phosphor compound.

It may be desirable to add pigments or filters to the phosphor compositions. Thus, the phosphor compositions and/or encapsulant may also comprise from 0 up to about 20% by weight (based on the total weight of the phosphors) of a pigment or other UV absorbent material capable of absorbing UV radiation having a wavelength between 250 nm and 500 nm.

Suitable pigments or filters include any of those known in the art that are capable of absorbing radiation generated between 250 nm and 500 nm. Such pigments include, for example, nickel titanate or praseodimium zirconate. The pigment is used in an amount effective to filter 10% to 100% of the radiation generated in the 250 nm to 450 nm range.

By assigning appropriate spectral weights for each phosphor compound, one can create spectral blends for use in each phosphor composition to cover the relevant portions of color space, especially for white lamps. Specific examples of this are shown below. For various desired color points, one can determine the identity and appropriate amounts of each phosphor compound to include in the individual compositions. Thus, one can customize phosphor blends for use in the compositions to produce almost any CCT or color point, with control over the CRI and luminosity based on the amount of each composition in the lighting device.

By use of the present embodiments wherein two or more phosphor compositions with the specified emission ranges are used in a lighting device, which has an overall emission spectrum with a depression between about 550 and 615 nm, lamps can be provided having customizable CRI and luminosity for a given color point. The preparation of each phosphor composition, including the identity and amounts of each phosphor compound present therein, and the evaluation of its contribution to the LED spectrum would be trivial for a person skilled in the art and can be done using established techniquest aided by, e.g., the DOE approach such as the preparation of a series of devices with various thicknesses of two phosphor compositions.

EXAMPLES

Light sources using phosphor blends according to the above embodiments may be produced. Several different exemplary prophetic trials are presented in Table 1. Different phosphor compositions were investigated targeting different color points on the black body locus of the CIE chromaticity diagram. These color points were chosen merely for illustration and by no means restricts the scope of applicability of this invention. An LED chip having a 405 nm emission was chosen for the trials.

TABLE 1

|  | 2500K lamp | 3500K lamp | 6500K lamp | 17500K lamp |
| --- | --- | --- | --- | --- |
| SECA | 0.0 | 6.1 | 22.2 | 34.0 |
| SPP | 14.8 | 18.9 | 16.4 | 0.0 |
| MFG | 57.9 | 42.6 | 25.6 | 23.6 |
| $SrAl_2O_4:Eu^{2+}$ | 22.3 | 27.4 | 30.8 | 37.4 |
| LED bleed, % | 5.0 | 5.0 | 5.0 | 5.0 |
| Chromaticity coordinates (x, y) | (0.478, 0.416) | (0.406, 0.394) | (0.314, 0.321) | (0.251, 0.271) |
| $R_{(1-14)}$ | 52 | 72 | 80 | 76 |
| $R_a$ | 60 | 76 | 85 | 83 |
| Yellow depression lowest emission intensity as % of highest intensity between 400-700 nm | 10.2 | 13.9 | 20.2 | 9.9 |

The spectral weight amounts of each phosphor as well as the residual phosphor bleed is listed for each trial in percents wherein the total combined spectral weight equals 100%.

Various other characteristics of the lamps are also noted in Table 1. The phosphors selected for these trials include $3.5MgO*0.5MgF_2*GeO_2:Mn^{4+}$ ("MFG"), $Sr_2P_2O_7:Eu^{2+}$, $Mn^{2+}$ ("SPP"), $SrAl_2O_4:Eu^{2+}$, and $(Ca,Sr,Ba)_5(PO_4)_3C:Eu^{2+}$ ("SECA").

It will be appreciated that although some of the the $R_{(1-14)}$ and $R_a$ values shown in Table 1 exceed 80, they tend to be significantly lower than 100, the values assigned by definition to the reference illuminants recommended internationally by the CIE. This is because the CRI values measure the degree to which the color rendering of the test sources (i.e., each of the given examples) conforms to the corresponding reference illuminants of the same CCT. Therefore, these values will penalize test sources enhancing color contrast (e.g. the LED lamps in this invention), just as they will penalize sources reducing color contrast (e.g. current commercial white LED solutions). For example, a REVEAL® lamp will have a typical $R_{(1-14)}$ average of 73 and a typical $R_a$ value of 77. It is however possible to observe the color contrast enhancements in an appropriate color space, e.g. the CIELAB space.

FIGS. 6-9 show the simulated emission spectra of the lamps listed in Table 1. FIGS. 10-14 are CIELAB diagrams for the REVEAL® lamp and these trial lamps compared to reference illuminants. The data points in each of the last 5 figures represent the perceived colors of the 14 standard test color samples specified internationally by the CIE under the trial lamp (triangles connected in consecutive order by a solid line) and the reference illuminant (diamonds connected in consecutive order by a dashed line). It can be seen that the trial lamps in FIGS. 11-14 show increased red-green color contrast versus the corresponding reference illuminants, evidenced by increased shifts of the data points in the horizontal direction of the CIELAB color space (i.e. the red-green direction), similarly to the REVEAL® lamp in FIG. 10. In some cases (e.g. the 2500K lamp in FIG. 12), the red-green color contrast is increased for all 14 standard test color samples.

FIGS. 5 and 10-14 were generated using an Excel spreadsheet obtained from: Y. Ohno, *Color Rendering and Luminous Efficacy of White LED Spectra*, Proc., SPIE Fourth International Conference on Solid State Lighting, Denver, Colo., August 2004, 5530, 88-98 (2004).

The invention has been described with reference to the preferred embodiments. Obviously, modifications and alterations will occur to others upon reading and understanding the preceding, detailed description. It is intended that the invention be construed as including all such modifications and alterations, insofar as they come within the scope of the appended claims or the equivalents thereof.

What is claimed is:

1. A lighting apparatus for emitting white light having enhanced red-green color contrast and comprising:
    a light source emitting radiation having a peak emission at from about 250 to 500 nm; and
    a phosphor blend radiationally coupled to said light source comprising: a first phosphor material having a peak emission between about 450 and 550 nm and a second phosphor material having a peak emission between about 615 and 670 nm; wherein an overall emission spectrum of the lighting apparatus has a depression between about 550 and 615 nm, said depression extending to between about 5% and 25% of the highest intensity of the emission spectrum of the lighting apparatus in the region from 400 to 700 nm; and said second phosphor is free of $(Mg,Ca,Sr,Ba,Zn)_4Si_2O_8:Eu^{2+},Mn^{2+}$.

2. The lighting apparatus of claim 1, wherein the depression is extending to between about 10% and 20% of the highest intensity of the emission spectrum of the lighting apparatus in the region from 400 to 700 nm.

3. The lighting apparatus of claim 1, wherein at least one of said first and second phosphor materials comprises two or more individual phosphor compounds.

4. The lighting apparatus of claim 1, wherein said first phosphor material comprises at least one of $(Ca,Sr,Ba)Al_2O_4:Eu^{2+}$; $(Mg,Ca,Sr,Ba)_5(PO_4)_3(F,Cl,Br,OH):Eu^{2+}$; $(Ca,Sr,Ba)MgAl_{10}O_{17}:Eu^{2+},Mn^{2+}$ and $Sr_4Al_{14}O_{25}:Eu^{2+}$.

5. The lighting apparatus of claim 1, wherein said second phosphor material comprises at least one of $3.5MgO*0.5MgF_2*GeO_2:Mn^{4+}$; $CaAlSiN_3:Eu^{2+}$ and $A_2[MF_6]:Mn^{4+}$ where A=Li, Na, K, Rb or Cs and M=Ge, Si, Sn, Ti or Zr.

6. The lighting apparatus of claim 1, wherein said lighting apparatus has an increased red-green color contrast versus the reference illuminant of the same CCT for all 14 test color samples specified by the CIE.

7. The lighting apparatus of claim 1, wherein said lighting apparatus has a general ($R_a$) CRI of at least 80.

8. The lighting apparatus of claim 1, wherein said phosphor blend further comprises one or more additional phosphors.

9. The lighting apparatus of claim 8, wherein said one or more additional phosphors are selected from the group including $(Ca,Sr,Ba)_2Si_{1-c}O_{4-2c}:Eu^{2+}$ where $0\leq c<0.25$; $(Ba,Sr,Ca)_5(PO_4)_3(Cl,F,Br,OH): Sb^{3+}, Mn^{2+}$; $(Mg,Ca, Sr,Ba,Zn)_5(PO_4)_3(F,Cl,Br,OH): Eu^{2+},Mn^{2+}$; $(Ba,Sr,Ca)BPO_5:Eu^{2+},Mn^{2+}$; $(Sr,Ca)_{10}(PO_4)_6*nB_2O_3:Eu^{2+}$; $Sr_2Si_3O_8*2SrCl_2:Eu^{2+}$; $BaAl_8O_{13}:Eu^{2+}$; $2SrO*0.84P_2O_5*0.16B_2O_3:Eu^{2+}$; $(Ba,Sr,Ca)Al_2O_4:Eu^{2+}$; $(Y,Gd,Lu,Sc,La)BO_3:Ce^{3+},Tb^{3+}$; $Ca_8Mg(SiO_4)_4Cl_2: Eu^{2+}, Mn^{2+}$; $(Ba,Sr,Ca)_2(Mg,Zn)Si_2O_7:Eu^{2+}$; $(Sr,Ca,Ba)(Al,Ga,In)_2S_4:Eu^{2+}$; $(Y,Gd,Tb,La,Sm,Pr,Lu)_3(Al,Ga)_5O_{12}:Ce^{3+}$; $(Ca,Sr)_8(Mg,Zn)(SiO_4)_4Cl_2:Eu^{2+},Mn^{2+}$; $Na_2Gd_2B_2O_7:Ce^{3+},Tb^{3+}$; $(Sr,Ca,Ba,Mg,Zn)_2P_2O_7:Eu^{2+},Mn^{2+}$; $(Ca,Sr,Ba,Mg,Zn)_{10}(PO_4)_6(F,Cl,Br,OH)_2:Eu^{2+},Mn^{2+}$; $(Gd,Y,Lu,La)_2O_3:Eu^{3+},Bi^{3+}$; $(Gd,Y,Lu,La)_2O_2S:Eu^{3+},Bi^{3+}$; $(Gd,Y,Lu,La)VO_4:Eu^{3+},Bi^{3+}$; $SrY_2S_4:Eu^{2+}$; $CaLa_2S_4:Ce^{3+}$; $(Ca,Sr)S:Eu^{2+}$;$(Ba,Sr,Ca)MgP_2O_7:Eu^{2+},Mn^{2+}$; $(Y,Lu)_2WO_6:Eu^{3+},Mo^{6+}$;$(Ba,Sr,Ca)_uSi_v(N,O)_w:Eu^{2+}$ and (Lu,Ca,Li,Mg,Y)alpha-SiAlON doped with $Eu^{2+}$ and/or $Ce^{3+}$.

10. The lighting apparatus of claim 1, wherein said light source comprises a nitride compound semiconductor represented by the formula $In_iGa_jAl_kN$, where $0\leq i; 0\leq j, 0\leq k$, and $i+j+k=1$.

11. The lighting apparatus of claim 1, further comprising a filter for preventing radiation from said light source from being emitted from said apparatus or reducing said radiation.

12. The lighting apparatus of claim 1, wherein the phosphor blend is coated on the surface of the light source.

13. The lighting apparatus of claim 1, further comprising an encapsulant surrounding the light source and the phosphor blend.

14. The lighting apparatus of claim 13, wherein the phosphor blend is dispersed in the encapsulant.

15. The lighting apparatus of claim 1, further comprising a reflector.

16. The lighting apparatus of claim 1, wherein a color point of said apparatus lies substantially on the black body locus within 0.020 units in the vertical direction on the 1931 CIE Diagram.

17. The lighting apparatus of claim 1, wherein a CCT of said apparatus is higher than 3000K.

18. The lighting apparatus of claim 1, wherein said first phosphor material comprises at least one of $(Ca,Sr,Ba)Al_2O_4:Eu^{2+}$; $(Mg,Ca,Sr,Ba)_5(PO_4)_3(F,Cl,Br,OH):Eu^{2+}$; $(Ca,Sr,Ba)MgAl_{10}O_{17}:Eu^{2+},Mn^{2+}$ and $Sr_4Al_{14}O_{25}:Eu^{2+}$; and said second phosphor material comprises at least one of $3.5MgO*0.5MgF_2*GeO_2:Mn^{4+}$; $CaAlSiN_3:Eu^{2+}$ and $A_2[MF_6]:Mn^{4+}$ where A=Li, Na, K, Rb or Cs and M=Ge, Si, Sn, Ti or Zr.

19. A method for making a lighting apparatus for emitting white light having enhanced red-green color contrast, the method including the steps of:
providing a light source emitting radiation having a peak emission at from about 250 to 500 nm;
providing a phosphor blend comprising: a first phosphor material having a peak emission between about 450 and 550 nm and a second phosphor material having a peak emission between about 615 and 670 nm; and
radiationally coupling said phosphor blend to said light source, wherein an overall emission spectrum of the lighting apparatus has a depression between about 550 and 615 nm, said depression extending to between about 5% and 25% of the highest intensity of the emission spectrum of the lighting apparatus in the region from 400 to 700 nm; and said second phosphor is free of $(Mg,Ca,Sr,Ba,Zn)_4Si_2O_8:Eu^{2+},Mn^{2+}$.

20. The method of claim 19, wherein said first phosphor material comprises at least one of $(Ca,Sr,Ba)Al_2O_4:Eu^{2+}$; $(Mg,Ca,Sr,Ba)_5(PO_4)_3(F,Cl,Br,OH):Eu^{2+}$; $(Ca,Sr,Ba)MgAl_{10}O_{17}:Eu^{2+}$, $Mn^{2+}$ and $Sr_4Al_{14}O_{25}:Eu^{2+}$.

21. The method of claim 19, wherein said second phosphor material comprises at least one of $3.5MgO*0.5MgF_2*GeO_2:Mn^{4+}$; $CaAlSiN_3:Eu^{2+}$ and $A_2[MF_6]:Mn^{4+}$ where A=Li, Na, K, Rb or Cs and M=Ge, Si, Sn, Ti or Zr.

22. The method of claim 19, wherein said first phosphor material comprises at least one of $(Ca,Sr,Ba)Al_2O_4:Eu^{2+}$; $(Mg,Ca,Sr,Ba)_5(PO_4)_3(F,Cl,Br,OH):Eu^{2+}$; $(Ca,Sr,Ba)MgAl_{10}O_{17}:Eu^{2+}$, $Mn^{2+}$ and $Sr_4Al_{14}O_{25}:Eu^{2+}$ and said second phosphor material comprises at least one of $3.5MgO*0.5MgF_2*GeO_2:Mn^{4+}$; $CaAlSiN_3:Eu^{2+}$ and $A_2[MF_6]:Mn^{4+}$ where A=Li, Na, K, Rb or Cs and M=Ge, Si, Sn, Ti or Zr.

* * * * *